PHOSPHORUS DIFFUSION SYSTEM
Filed May 5, 1966
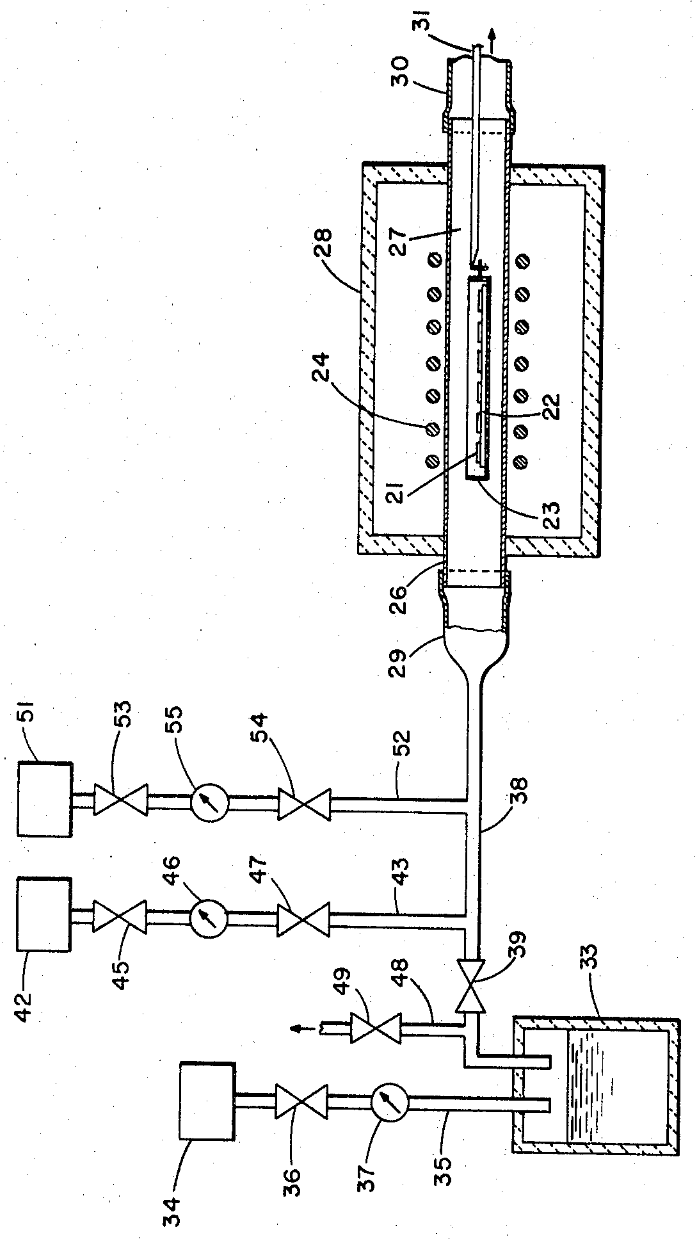
INVENTORS,
Tommie R. Huffman
Gary G. Ehlenberger
Robert A. McDonald
Mueller, Aichele & Rauner
ATTY'S.

United States Patent Office 3,442,725

Patented May 6, 1969

3,442,725

PHOSPHORUS DIFFUSION SYSTEM

Tommie R. Huffman, Tempe, and Gary G. Ehlenberger and Robert A. McDonald, Phoenix, Ariz., assignors to Motorola Inc., Franklin Park, Ill., a corporation of Illinois Filed May 5, 1966, Ser. No. 548,013
Int. Cl. H01l 7/44
U.S. Cl. 148—189 3 Claims

ABSTRACT OF THE DISCLOSURE

A monocrystalline semiconductor element is doped with a phosphorus-comprising impurity by a method which includes the steps of forming a gas mixture of the dopant and a diluent gas, then metering at least a portion of the mixture into a mainstream of diluent gas, and then contacting the semiconductor element with the resulting gas mixture at a diffusion temperature. The diffusion of phosphorus is terminated while the conductivity of the diffused region is less than about $1.2\times10^3$ (ohm-centimeters)$^{-1}$.

This invention relates to a new and improved phosphorus diffusion system and relates to a phosphorus doped semiconductor device which is substantially free of lattice imperfections.

Phosphorus is commonly employed as a doping impurity in the fabrication of semiconductor devices. For example, phosphorus is diffused into a semiconductor crystal element such as single crystal silicon to change the electrical characteristics of the crystal element, that is, by the formation of a PN junction or by increasing the conductivity of the crystal element or portions thereof. One of the problems that has been encountered in the use of phosphorus as a doping impurity has been that as the phosphorus diffuses into the crystal element, lattice imperfections such as dislocations are induced in the crystal element. These imperfections tend to form networks of so-called "edge dislocations" which may appear as slip patterns or high density dislocation areas. These dislocation areas can cause a mismatch in the lattice which may induce sufficient stress at diffusion temperatures to exceed the elastic limit of the crystal element.

A further problem resulting from the phosphorus induced imperfections is that gold subsequently diffused into the element tends to segregate near the imperfections. Devices produced from elements with such imperfections may be adversely affected in various characteristics including leakage current, noise figures, anomalous piping in the junctions and majority carrier lifetime in the emitter and offset voltage.

An object of the present invention is to provide a phosphorus diffusion system in which the formation of lattice imperfections is substantially eliminated.

Another object of the invention is to provide a phosphorus diffusion system which permits uniform, reproducible diffusion of phosphorus into semiconductor elements at concentrations less than solid solubility.

A further object of the invention is to provide a phosphorus diffused semiconductor crystal element which may be fabricated into semiconductor devices having improved electrical characteristics.

A feature of the present invention is a system in which the diffusion of a gaseous source of phosphorus into a semiconductor element is accurately controlled to form a diffused region having a conductivity less than about $1.2\times10^3$ (ohm-centimeters)$^{-1}$.

A further feature of the invention is a semiconductor crystal element with such a phosphorus diffused region.

The invention will be described in greater detail with reference to the accompanying drawing, the single figure of which is a schematic diagram of a phosphorus diffusion system of the invention.

The present invention is embodied in a phosphorus diffusion system including a source of phosphorus doping impurity, means for forming a gas mixture comprising the impurity and a diluent gas, means for metering at least a portion of the gas mixture into a mainstream of diluent gas to form a diffusion gas mixture containing a small predetermined proportion of the phosphorus doping impurity, and a reactor in which a semiconductor crystal element is contacted by the diffusion gas mixture while the crystal element is maintained at an elevated temperature to diffuse phosphorus into the crystal element to form a diffused region therein having a conductivity less than about $1.2\times10^3$ (ohm-centimeters)$^{-1}$.

The invention is also embodied in a method of diffusing phosphorus into a semiconductor crystal element which includes the steps of forming a gas mixture comprising a phosphorus doping impurity and a diluent gas, metering at least a portion of the gas mixture into a mainstream of diluent gas to form a diffusion gas mixture containing a small predetermined proportion of the phosphorus doping impurity, contacting a semiconductor crystal element with the diffusion gas mixture while the crystal element is maintained at an elevated temperature to diffuse phosphorus into the crystal element and form a diffused region therein, and terminating the diffusion of phosphorus while the conductivity of the diffused region is less than about $1.2\times10^3$ (ohm-centimeters)$^{-1}$.

The invention is further embodied in a semiconductor crystal element having a diffused phosphorus-containing region therein of a conductivity less than about $1.2\times10^3$ (ohm-centimeters)$^{-1}$.

The semiconductor crystal element which is subjected to treatment in accordance with the invention is advantageously a single crystal element of silicon although various other semiconductor materials also may be employed. The crystal element preferably is a wafer which is typically obtained from a larger crystal grown by known crystal pulling or zone melting processes. The larger crystal is sliced into wafers and the wafers lapped, polished and otherwise processed to make their major surfaces substantially parallel to each other. The cross-sectional dimension of the wafers may be of any value and the thickness can be within a practical range, e.g., about 2 to 40 mils.

The source of the phosphorus doping impurity may be one of the known phosphorus compounds which are in a gaseous state normally or which may be conveniently converted to a gaseous or vapor state. Suitable materials include phosphorus halides, oxyhalides, oxides, elemental phosphorus, phosphine, etc., such as phosphorus oxychloride, phosphorus pentoxide, phosphorus tribromide and the like.

To provide the required high degree of control over the proportion of the phosphorus doping impurity contacting the crystal element, in accordance with the invention, the phosphorus doping impurity is first mixed with a substantial amount of an essentially inert diluent carrier gas such as nitrogen, hydrogen, argon, helium, etc., and then a portion or all of this gas mixture is incorporated into a mainstream of diluent gas. In this way, the invention provides a simple and convenient system for forming a uniform diffusion gas mainstream having a relatively high flow rate and containing a very small, accurately controlled amount of a phosphorus doping impurity.

Prior to the introduction of the diffusion gas mixture into the diffusion chamber, minor amounts of other materials may be added to the mixture. For example, small amounts of oxygen may be added.

In forming the initial mixture of the phosphorus doping impurity and the diluent gas, it is advantageous to employ a major proportion of the diluent gas so the phosphorus doping impurity will constitute a minor proportion thereof, preferably less than about 10% and particularly between about 0.1% and 5% by volume. Advantageously, a portion of this mixture is then incorporated into the main diffusion gas stream. Advantageously, the proportion added is such that the percentage by volume of the phosphorus doping impurity is between about $10^{-4}\%$ and 1% by volume of the diffusion gas stream and preferably between about $10^{-3}\%$ and 0.1%. The other materials such as oxygen incorporated in the gas stream advantageously constitute less than about 0.5% by volume of the diffusion gas mixture.

The mixture is brought into contact with the crystal element or wafer while it is at an elevated temperature and preferably at a temperature between about 900° and 1200° C. The flow rate of the diffusion gas stream over the crystal element is advantageously between about 0.1 and 10 liters per minute per square inch of cross section of the diffusion chamber or tube, and preferably between about 0.1 and 5 liters per minute.

The diffusion of the phosphorus into the crystal element is terminated before the conductivity of the diffused region reaches $1.2\times10^3$ (ohm-centimeters)$^{-1}$. For example, this conductivity corresponds to a sheet resistivity of about 4 ohms per square at a junction depth of about 2 microns. The surface concentration of phosphorus at this conductivity is believed to be approximately $10^{21}$ atoms per cubic centimeter.

A phosphorus diffusion system of the invention is shown in the drawing. In the embodiment illustrated, single crystal semiconductor wafers or other suitable substrates 21 are placed on a slab of quartz 22 carried in a boat 23. The boat 23 is heated by resistance coils 24 which are located on the outside of a quartz tube 26 which forms a reaction chamber 27. The chamber is enclosed in a suitable housing 28. The diffusion gas mixture is introduced into the reaction chamber 27 through an inlet 29, and the excess leaves the chamber through an outlet 30 and is vented. The temperature within the reaction chamber may be measured by a thermocouple which is not shown in the drawing. The boat 23 is positioned within the chamber 27 with a rod 31 through the outlet of the tube.

The gaseous mixture may be formed from a liquid doping impurity compound, for example, phosphorus oxychloride, contained in a source bottle 33. Nitrogen gas from a supply 34 is passed over or through the liquid by means of a suitable piping line 35. The flow rate of the nitrogen gas is controlled by a valve 36 and measured by a meter 37. An outlet line 38 from the source bottle 33 leads to the inlet 29 of the reaction chamber 27 through valve 39.

The phosphorus doping impurity mixture is incorporated into a mainstream of nitrogen gas from supply 42 which passes through line 43 into main line 38. Line 43 has a valve 45, a meter 46 and a shut-off valve 47. To accurately control the proportion of the doping impurity in the main diffusion gas mixture, a portion of the doping impurity mixture is incorporated into the main gas stream in line 38. The remainder of the doping impurity mixture is vented through line 48 which has a valve 49. Additional materials such as oxygen from a supply 51 may be added to the main diffusion gas mixture through a piping line 52 which connects to main line 38. Line 52 has valves 53 and 54 and flow meter 55.

The following examples illustrate specific embodiments of the invention, although it is not intended that the examples restrict the scope of the invention. In the examples, percentages are by volume.

EXAMPLE I

A number of single crystal silicon wafers of a size about 1 inch in diameter and about 10 mils thick and having a resistivity of about 2 ohm-centimeters of P type conductivity by boron doping, which had been etched and polished, were examined and found to be free of lattice imperfections. These wafers were placed on a quartz boat and inserted in a diffusion furnace. The wafers were heated to a temperature of about 1100° C., and then a diffusion gas stream was passed over the surfaces of the wafers. The gas stream was formed by passing nitrogen gas at a flow rate of about 10 cubic centimeters per minute over liquid phosphorus oxychloride maintained at a temperature of about 0° C. The resulting mixture containing about 0.1% phosphorus oxychloride was added to a mainstream of nitrogen gas having a flow rate of about 1 liter per minute. The phosphorus oxychloride gas mixture was added to the mainstream at a rate of about 10 cubic centimeters per minute to provide a concentration of the phosphorus compound in the mainstream of about $10^{-3}\%$. The diffusion furnace had a cross-sectional area of about 3 square inches.

After about 35 minutes, the boat on which the wafers were positioned was removed from the diffusion furnace and cooled. The resulting wafers were subjected to a Sirtl dislocation etch, examined under a 400 power microscope and found to be free of lattice imperfections such as dislocations or slip patterns. The resistivity was measured with a 50 mil, D.C., four-point probe and found to be 4 ohms per square. The junction depth was measured using an angle lapping technique employing a monochromatic interferometer and found to be about 2 microns.

To determine if any inactive phosphorus was present in the diffused regions, the wafers were neutron activated according to a procedure reported by Tannenbaum in Solid States Electronics, vol. 2, p. 123 (1961). The wafers were neutron activated to convert the diffused phosphorus into the radioactive isotope, $P^{32}$. Thereafter, portions of the diffused regions were incrementally removed by anodization. The sheet resistivity was measured with the four-point probe and the beta radiation of the radioactive phosphorus counted with an open end Geiger tube after each increment was removed. From these values, both the electrically active phosphorus and total phosphorus profiles were determined. It was found that all of the phosphorus was electrically active and no inactive phosphorus was present.

In contrast to the above results, the procedure was repeated, but the concentration of the phosphorus oxychloride in the mainstream was increased to 2%. The diffused wafers produced were tested according to the above procedure and showed profiles in which the electrically active phosphorus comprised only about 50% of the total phosphorus. Also, a substantial number of dislocations and slip patterns were observed under the microscope.

Other wafers prepared according to each of the above procedures were subjected to a gold diffusion treatment, and the wafers thereafter examined. It was found that the gold in the wafers prepared according to the procedure of the invention had a substantially uniform concentration throughout the diffused regions. In contrast, the wafers prepared with the larger amounts of phosphorus impurity in the diffusion gas stream showed nonuniformity of gold with increased gold concentrations in the dislocated regions. Devices were made with both groups of wafers, and it was found that the wafers made according to the procedure of the invention had an apparent increase in majority carrier lifetime in the emitter and lower offset voltages than did the other devices. Also, the noise figures in power transistors produced from such wafers were reduced by three orders of magnitude in devices made from the wafers of the invention, and the reverse leakage currents were reduced by an order of magnitude. Thus, devices made with wafers in which the phosphorus diffusion was conducted in accordance with the invention were superior to those of conventionally produced devices.

EXAMPLE II

The procedure of this example was the same as that of Example I except that the amount of diluted phosphorus oxychloride mixture metered into the mainstream was controlled to produce a concentration of phosphorus oxychloride in the diffusion gas mixture of 0.1%.

The wafers and devices produced therefrom showed the same superior results as did the wafers produced according to the system of the invention as reported in Example I.

EXAMPLE III

The procedure of this example was the same as that of Example I except that the compound used for the doping impurity was phosphorus tribromide. The proportion of the bromide in the diffusion gas mixture was 0.01% and the flow rate of the mixture was about 1 liter per minute. Results were the same as Example I.

EXAMPLE IV

The procedure of this example was the same as that of Example I except that the concentration of phosphorus oxychloride in the diffusion gas mixture was reduced to about $10^{-4}$%, the flow rate in the diffusion gas mixture was increased to 10 liters per minute and the temperature of the wafers was reduced to about 1000° C. A base diffusion was performed under the above conditions with the phosphorus concentration less than solid solubility. The wafers and devices showed the improvements of those of Example I.

The above description, examples and drawing show that the present invention provides a novel phosphorus diffusion system in which the formation of lattice imperfections is substantially eliminated. Moreover, the system of the invention provides diffusions at concentrations less than solid solubility with uniformity and reproducibility. In addition, semiconductor devices formed from phosphorus diffused semiconductor crystal elements of the invention have improved majority carrier lifetime and offset voltage, and reduced leakage current and noise figures.

We claim:

1. A method of diffusing phosphorus into a semiconductor crystal element which includes the steps of forming a gas mixture comprising a phosphorus doping impurity and a diluent gas, metering at least a portion of said gas mixture into a mainstream of said diluent gas to form a diffusion gas mixture containing less than about 1% by volume of phosphorus doping impurity, passing said diffusion gas mixture over said crystal element at a rate between about 0.1 and 10 liters per minute per square inch of chamber cross section while maintaining said crystal element at a temperature of 900° C. to 1200° C. to diffuse phosphorus into said element and form a diffused region therein, and terminating the diffusion of said phosphorus while the conductivity of said diffused region is less than about $1.2 \times 10^3$ (ohm-centimeters)$^{-1}$.

2. A method according to claim 1 in which said phosphorus doping impurity is phosphorus oxychloride, and said diluent gas is nitrogen.

3. A method according to claim 1 in which a small amount of oxygen gas is added to said diffusion gas mixture prior to contact with said crystal element.

References Cited

UNITED STATES PATENTS

| | | | |
|---|---|---|---|
| 2,804,405 | 8/1957 | Derick | 148—187 X |
| 3,133,840 | 5/1964 | Gibson | 148—189 |
| 3,243,323 | 3/1966 | Corrigan | 148—187 |
| 3,244,567 | 4/1966 | Crishal | 148—189 |

OTHER REFERENCES

"Silicon Semiconductor Technology," pp. 155 and 156, by W. R. Runyan, published by McGraw-Hill Book Co., 1965.

L. DEWAYNE RUTLEDGE, *Primary Examiner.*

R. A. LESTER, *Assistant Examiner.*

U.S. Cl. X.R.

29—576; 148—186